(12) United States Patent
Wu

(10) Patent No.: US 8,335,974 B2
(45) Date of Patent: Dec. 18, 2012

(54) BINARY BCH DECODERS

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 0 days.

(21) Appl. No.: 13/359,912

(22) Filed: Jan. 27, 2012

(65) Prior Publication Data

US 2012/0131423 A1      May 24, 2012

Related U.S. Application Data

(63) Continuation of application No. 12/070,892, filed on Feb. 21, 2008, now Pat. No. 8,132,081.

(51) Int. Cl.
*G06F 11/00*      (2006.01)

(52) U.S. Cl. ....................................................... 714/782

(58) Field of Classification Search ............... 714/782
See application file for complete search history.

(56) References Cited

U.S. PATENT DOCUMENTS

2004/0177312 A1*    9/2004   Xin ................................ 714/782

* cited by examiner

*Primary Examiner* — Scott Baderman
*Assistant Examiner* — Jigar Patel
(74) *Attorney, Agent, or Firm* — Van Pelt, Yi & James LLP

(57) ABSTRACT

Binary Bose-Chaudhuri-Hocquenghem (BCH) encoded data is processed by obtaining a set of syndromes associated with the binary BCH encoded data, including a subset of odd-term syndromes and a subset of even-term syndromes. During initialization of a variant error-locator polynomial, $\hat{\Omega}(x)$, the subset of even-term syndromes, but not the subset of odd-term syndromes, are loaded into the variant error-locator polynomial, $\hat{\Omega}^{(0)}(x)$.

16 Claims, 7 Drawing Sheets

Processor Element (PE')

BINARY BCH DECODERS

CROSS REFERENCE TO OTHER APPLICATIONS

This application is a continuation of co-pending U.S. patent application Ser. No. 12/070,892 entitled BINARY BCH DECODERS filed Feb. 21, 2008 which is incorporated herein by reference for all purposes.

BACKGROUND OF THE INVENTION

Binary Bose-Chaudhuri-Hocquenghem (BCH) codes are commonly used error correcting codes in modern communication systems. Long BCH codes with block lengths of 32400 bits or longer are used as the outer forward error correcting code in the second generation Digital Video Broadcasting (DVB-S2) Standard from the European Telecommunications Standard Institute (ESTI). Recently, long BCH codes have been investigated for the on-chip error correction of multi-level NAND flash memories. Binary BCH codes are also used in disk drive systems. In many of these applications of BCH codes, the BCH coder-decoder is implemented in hardware, such as an application specific integrated circuit (ASIC). It would be desirable if BCH codes could be implemented in a manner that reduces power consumption and/or size. Systems that include such a BCH component could be made smaller, could operate longer off of a battery, etc.

BRIEF DESCRIPTION OF THE DRAWINGS

Various embodiments of the invention are disclosed in the following detailed description and the accompanying drawings.

DETAILED DESCRIPTION

Figure 1A:
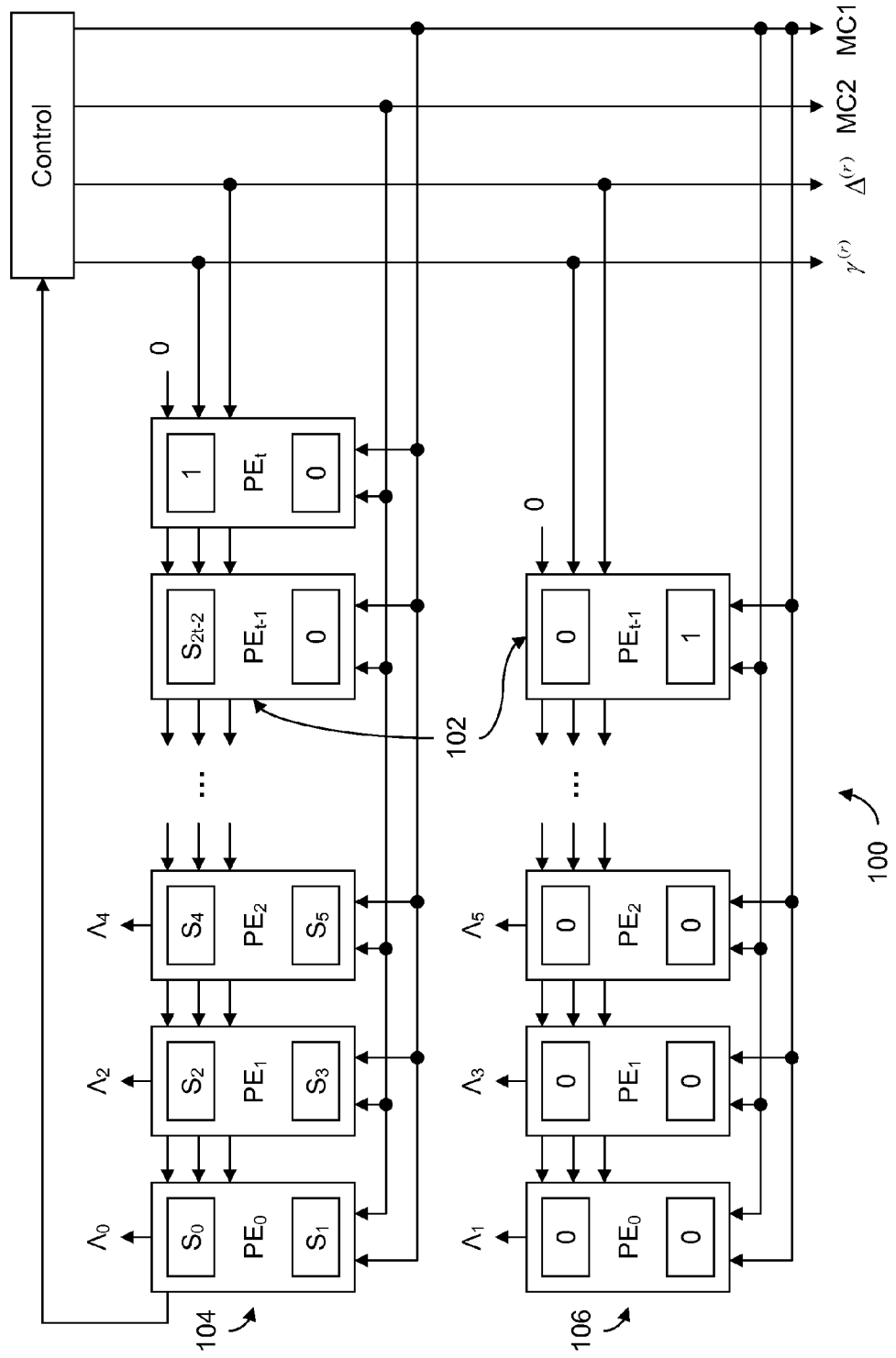
FIG. 1A is a block diagram illustrating an embodiment of a system that does not load syndromes into an odd-term array.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Since binary BCH codes are subfield subcodes of Reed-Solomon codes, high-speed decoder architectures for Reed-Solomon codes can also be used to decode binary BCH codes. Binary BCH codes exhibit three distinctive features: (i) generator polynomial coefficients are binary so that multiplication is reduced to a logical AND operation; (ii) error magnitude is always one and thus does not need to be computed through the Formey formula; (iii) the corresponding Berlekamp process skips all odd-numbered iterations of the Berlekamp-Massey process.

What are presented herein are three high-speed decoder architectures for binary BCH codes. In a first embodiment, data is split into odd-indexed data and even-indexed data. Even-indexed syndromes, but not odd-indexed syndromes, are loaded into a variant error-locator array, sometimes referred to as a variant error-locator polynomial. The architecture of the first embodiment has 2t+1 systolic units, where t is an error correction capability of the code. As used herein, a systolic unit (also referred to as a processor element) is a block, module, or piece of code configured to perform a certain process or function that is repeated in a system. In embodiments with systolic architectures, complexity and latency can be traded off. In ASIC devices, little or no power is consumed if the output of an ASIC circuit does not toggle or change. In some embodiments, not loading syndromes into the odd-term array means that zeros or some other constant is loaded and the outputs of the ASIC circuits associated with the odd-term array do not switch. In some cases, there is a 25% power saving.

To implement the first embodiment, in some cases only a control module or piece of code associated with initialization or loading initial values in an existing system needs to be changed. For example, once the proper values are loaded into some processor or data array, the subsequent processing may be the same.

The second embodiment changes the odd-term array of the first embodiment into a normal (e.g., unshifted) error-locator update architecture. The architecture of this second embodiment has $$\left\lfloor \frac{3t+3}{2} \right\rfloor$$

units.

Whereas the first embodiment offers power savings, the second embodiment offers both power savings and a smaller size. However, where there is a single, common PE for the first embodiment, the second embodiment has two common PEs: one for an odd-term array and one for an even-term array.

The third embodiment removes the odd-term array from the first embodiment and squeezes the odd-term error-locator update into the even-term array. It employs t+f systolic units with a defect probability of $2^{-m(f+1)}$, where m denotes the finite field dimension and f is a design parameter. In other words, the smaller size of the third embodiment comes at the expense of a non-zero probability that the decoder will not generate the proper output. This non-zero probability can be controlled by the design parameter f. In applications where an extremely small size is desired, this third embodiment may be very attractive.

The underlying generator polynomial of a BCH code contains consecutive roots $\alpha, \alpha^2, \ldots, \alpha^{2t}$. For an underlying binary BCH code, the designed minimum distance d is always odd, which is actually a lower bound of the true minimum distance.

Let C(x) denote the transmitted codeword polynomial and R(x) the received word polynomial. The decoding objective is to determine the error polynomial E(x) such that C(x)=R(x)−E(x).

In the following, the Berlekamp process is introduced. It begins with the task of error correction by computing syndrome values $$S_i = S_i = R(\alpha^{i+1}) = C(\alpha^{i+1}) + E(\alpha^{i+1}) = E(\alpha^{i+1}), i=0, 1, 2, \ldots, 2t-1.$$

If all 2t syndrome values are zero, then R(x) is a codeword polynomial and thus is presumed that C(x)=R(x), i.e., no errors have occurred. Otherwise, let e denote the (unknown) number of errors, $X_i \in \{\alpha^{-i}\}_{i=0}^{n-1}$, $i=1, 2, \ldots, e$, denote the error locations.

The syndrome polynomial is defined to be:

$$S(x) \triangleq S_0 + S_1 x + S_2 x^2 + \ldots + S_{2t-1} x^{2t-1}, \quad (1)$$

the error locator polynomial:

$$\Lambda(x) \triangleq \prod_{i=1}^{e}(1 - X_i x) = 1 + \Lambda_1 x + \Lambda_2 x^2 + \ldots + \Lambda_e x^e, \quad (2)$$

and the error evaluator polynomial:

$$\Omega(x) \triangleq \sum_{i=1}^{e} X_i \prod_{j=1, j \neq i}^{e} (1 - X_j x) = \Omega_0 + \Omega_1 x + \Omega_2 x^2 + \ldots + \Omega_{e-1} x^{e-1}. \quad (3)$$

The three polynomials satisfy the following key equation:

$$\Omega(x) = \Lambda(x) S(x) (\mathrm{mod}\, x^{2t}). \quad (4)$$

The Berlekamp process is a simplified version of the Berlekamp-Massey process for decoding binary BCH codes by incorporating the special syndrome property $$S_{2i+1} = S_i^2, i=0, 1, 2, \ldots$$

which yields zero discrepancies at odd-numbered iterations of the Berlekamp-Massey process. Below the inversionless Berlekamp process is re-formulated slightly, so as to facilitate the characterizations thereafter.

---

Inversionless Berlekamp Process

Input: $S = [S_0, S_1, S_2, \ldots, S_{2t-2}]$
Initialization: $\Lambda^{(0)}(x) = 1$, $B^{(-1)}(x) = x^{-1}$, $\gamma^{(0)} = 1$, $L_\Lambda^{(0)} = 0$, $L_B^{(-1)} = -1$
• For $r = 0, 2, \ldots, 2(t-1)$, do:
 - Compute $\Delta^{(r+2)} = \Sigma_{i=0}^{L_\Lambda^{(r)}} \Lambda_i^{(r)} \cdot S_{r-i}$
 - Compute $\Lambda^{(r+2)}(x) = \gamma^{(r)} \cdot \Lambda^{(r)}(x) - \Delta^{(r+2)} \cdot x^2 B^{(r-1)}(x)$
 - If $\Delta^{r+2} \neq 0$ and $2L_\Lambda^{(r)} \leq r$, then
 * Set $B^{(r+1)}(x) \leftarrow \Lambda^{(r)}(x)$
 * Set $\gamma^{(r+2)} \leftarrow \Delta^{(r+2)}$
 * Set $L_\Lambda^{(r+2)} \leftarrow L_B^{(r-1)} + 2$, $L_B^{(r+1)} \leftarrow L_\Lambda^{(r)}$
 - Else
 * Set $B^{(r+1)}(x) \leftarrow x^2 B^{(r-1)}(x)$
 * Set $\gamma^{(r+2)} \leftarrow \gamma^{(r)}$
 * Set $L_B^{(r+1)} \leftarrow L_B^{(r-1)} + 2$, $L_\Lambda^{(r+2)} \leftarrow L_\Lambda^{(r)}$
 endif
endfor
Output: $\Lambda(x), L_\Lambda$

---

The following lemma characterizes the lengths of linear-feedback shift registers, $L_\Lambda^{(r)}$ and $L_B^{(r-1)}$.

Lemma 1: The lengths of linear-feedback shift registers corresponding to $\Lambda^{(r)}(x)$ and $B^{(r-1)}(x)$ satisfy $$L_\Lambda^{(r)} + L_B^{(r-1)} = r - 1 \quad (5)$$

After constructing the error locator polynomial $\Lambda(x)$, the Chien search is applied to determine all valid roots.

Parallel Inversionless Berlekamp Processes and their Architectures

A parallel Berlekamp-Massey process is one in which the discrepancy computation and error-locator updates are performed simultaneously. Note that in the conventional (i.e., non-parallel) Berlekamp-Massey process, the discrepancy value $\Delta^{(r)}$ is computed based on the error locator polynomial $\Lambda^{(r)}(x)$, which is the primary cause of the high latency. In some cases, the discrepancies are generated iteratively so that they are operated on in parallel to update of the error locator polynomial.

First a left-shift operator "$\mathscr{L}$" of a polynomial is defined such that $$[\mathscr{L}_r A](x) \triangleq [A(x) - (A(x) \mathrm{mod}\, x^r)] / x^r \quad (6)$$

An alternative interpretation gives more insight. Let $A = [A_0, A_1, A_2, \ldots, A_l]$ be the vector representation of the polynomial A(x), then $\mathscr{L}_r A = [A_r, A_{r+1}, \ldots, A_l]$. The discrepancy values of the inversionless Berlekamp process are iteratively generated by the following pseudo code:

---

Iterative Discrepancy Computation Process

Input: $S = [S_0, S_1, S_2, \ldots, S_{2t-2}]$
Initialization: $\hat{\Omega}^{(0)}(x) = S(x)$, $\hat{\Theta}^{(-1)}(x) = [\mathscr{L}_1 S](x)$, $\gamma^{(0)} = 1$, $L_\Lambda^{(0)} = 0$, $L_B^{(-1)} = -1$
• For $r = 0, 2, 4, \ldots, 2(t-1)$, do:
 - $\hat{\Omega}^{(r+2)}(x) = \gamma^{(r)} \cdot [\mathscr{L}_2 \hat{\Omega}^{(r)}](x) - \hat{\Omega}_0^{(r)} \cdot \hat{\Theta}^{(r-1)}(x)$
 - If $\hat{\Omega}_0^{(r)} \neq 0$ and $2L_\Lambda^{(r)} \leq r$, then
 * Set $\hat{\Theta}^{(r+1)}(x) B^{(r+1)}(x) \leftarrow [\mathscr{L}_2 \hat{\Omega}^{(r)}](x)$
 * Set $\gamma^{(r+2)} \leftarrow \hat{\Omega}_0^{(r)}$
 * Set $L_\Lambda^{(r+2)} \leftarrow L_B^{(r-1)} + 2$, $L_B^{(r+1)} \leftarrow L_\Lambda^{(r)}$
 - Else
 * Set $\hat{\Theta}^{(r+1)}(x) \leftarrow \hat{\Theta}^{(r-1)}(x)$
 * Set $\gamma^{(r+2)} \leftarrow \gamma^{(r)}$
 * Set $L_B^{(r+1)} \leftarrow L_B^{(r-1)} + 2$, $L_\Lambda^{(r+2)} \leftarrow L_\Lambda^{(r)}$
 endif
endfor
Output: $\Delta = [\hat{\Omega}_0^{(0)}, \hat{\Omega}_0^{(2)}, \hat{\Omega}_0^{(4)}, \ldots, \hat{\Omega}_0^{(2t-2)}]$ Note that $\hat{\Omega}^{(r)}(x)$ and $\hat{\Theta}^{(r)}(x)$ is a left-shifted polynomial of $\Lambda^{(r)}(x)S(x)$ and $B^{(r)}(x)S(x)$ respectively, more specifically, $$\hat{\Omega}^{(r)}(x) = [\mathscr{L}_r(\Lambda^{(r)}S)](x),$$

$$\hat{\Theta}^{(r)}(x) = [\mathscr{L}_r(B^{(r)}S)](x),$$

where $\Lambda^{(r)}(x)$ and $B^{(r)}(x)$ denote the error locator polynomial couple generated during the r-th iteration of the Berlekamp process. Herein $\hat{\Omega}(x)$ is called a variant error-locator polynomial, due to the following $$\Lambda^{(r)}(x)S(x) = \Omega^{(r)}(x) + x^r\hat{\Omega}^{(r)}(x).$$

Observe that the odd terms of $\hat{\Omega}(x)$ and $\hat{\Theta}(x)$ are never exploited in the above iteration. Therefore, the above process can be refined by removing the odd terms.

---

Improved Iterative Discrepancy Computation Process

Input: $S = [S_0, S_1, S_2, ..., S_{2t-2}]$
Initialization: $\hat{\Omega}^{(0)}(x) = S_0 + S_2x^2 + S_4x^4 + ... + S_{2t-2}x^{2t-2}$
$\hat{\Theta}^{(-1)}(x) = S_1 + S_3x^2 + S_5x^4 + ... + S_{2t-3}x^{2t-4}$
$\gamma^{(0)} = 1, L_\Lambda^{(0)} = 0, L_B^{(-1)} = -1$
• For $r = 0, 2, 4, ..., 2(t-1)$, do:
- $\hat{\Omega}^{(r+2)}(x) = \gamma^{(r)} \cdot [\mathscr{L}_2\hat{\Omega}^{(r)}](x) - \hat{\Omega}_0^{(r)} \cdot \hat{\Theta}^{(r-1)}(x)$
- If $\hat{\Omega}_0^{(r)} \neq 0$ and $2L_\Lambda^{(r)} \leq r$, then
  * Set $\hat{\Theta}^{(r+1)}(x) \leftarrow [\mathscr{L}_2\hat{\Omega}^{(r)}](x)$
  * Set $\gamma^{(r+2)} \leftarrow \hat{\Omega}_0^{(r)}$
  * Set $L_\Lambda^{(r+2)} \leftarrow L_B^{(r-1)} + 2, L_B^{(r+1)} \leftarrow L_\Lambda^{(r)}$
- Else
  * Set $\hat{\Theta}^{(r+1)}(x) \leftarrow \hat{\Theta}^{(r-1)}(x)$
  * Set $\gamma^{(r+2)} \leftarrow \gamma^{(r)}$
  * Set $L_B^{(r+1)} \leftarrow L_B^{(r-1)} + 2, L_\Lambda^{(r+2)} \leftarrow L_\Lambda^{(r)}$
endif
endfor
Output: $\Delta = [\hat{\Omega}_0^{(0)}, \hat{\Omega}_0^{(2)}, \hat{\Omega}_0^{(4)}, ..., \hat{\Omega}_0^{(2t-2)}]$

---

By dynamically enforcing a term of $\hat{\Theta}(x)$ to zero, the unit of discrepancy computation and the unit of error-locator update can be seamlessly merged. By incorporating the method into the above Improved Iterative Discrepancy Computation Process and combining left-shifted error-locator update, a parallel Berlekamp process is obtained as follows.

---

Parallel Inversionless Berlekamp Process (PIB)

Input: $S = [S_0, S_1, S_2, ..., S_{2t-2}]$
Initialization: $\hat{\Omega}^{(0)}(x) = S_0 + S_2x^2 + S_4x^4 + ... + S_{2t-2}x^{2t-2} + x^{2t}$
$\hat{\Theta}^{(-1)}(x) = S_1 + S_3x^2 + S_5x^4 + ... + S_{2t-3}x^{2t-4} + x^{2t-1}$
$\gamma^{(0)} = 1, L_\Lambda^{(0)} = 0, L_B^{(-1)} = -1$
• For $r = 0, 2, 4, ..., 2(t-1)$, do:
- $\hat{\Omega}^{(r+2)}(x) = \gamma^{(r)} \cdot [\mathscr{L}_2\hat{\Omega}^{(r)}](x) - \hat{\Omega}_0^{(r)} \cdot \hat{\Theta}^{(r-1)}(x)$
- If $\hat{\Omega}_0^{(r)} \neq 0$ and $2L_\Lambda^{(r)} \leq r$, then
  * Set $\hat{\Theta}^{(r+1)}(x) \leftarrow [\mathscr{L}_2\hat{\Omega}^{(r)}](x)$
  * Set $\gamma^{(r+2)} \leftarrow \hat{\Omega}_0^{(r)}$
  * Set $L_\Lambda^{(r+2)} \leftarrow L_B^{(r-1)} + 2, L_B^{(r+1)} \leftarrow L_\Lambda^{(r)}$
- Else
  * Set $\hat{\Theta}^{(r+1)}(x) \leftarrow \hat{\Theta}^{(r-1)}(x)$
  * Set $\gamma^{(r+2)} \leftarrow \gamma^{(r)}$
  * Set $L_B^{(r+1)} \leftarrow L_B^{(r-1)} + 2, L_\Lambda^{(r+2)} \leftarrow L_\Lambda^{(r)}$
endif
- Set $\hat{\Theta}_{2t-r-4}^{(r+1)} = 0$
endfor
Output: $\Lambda = [\hat{\Omega}_0^{(2t)}, \hat{\Omega}_1^{(2t)}, \hat{\Omega}_2^{(2t)}, ..., \hat{\Omega}_t^{(2t)}]$

---

The following figure shows a block diagram of the above PIB process.

Figure 1B:
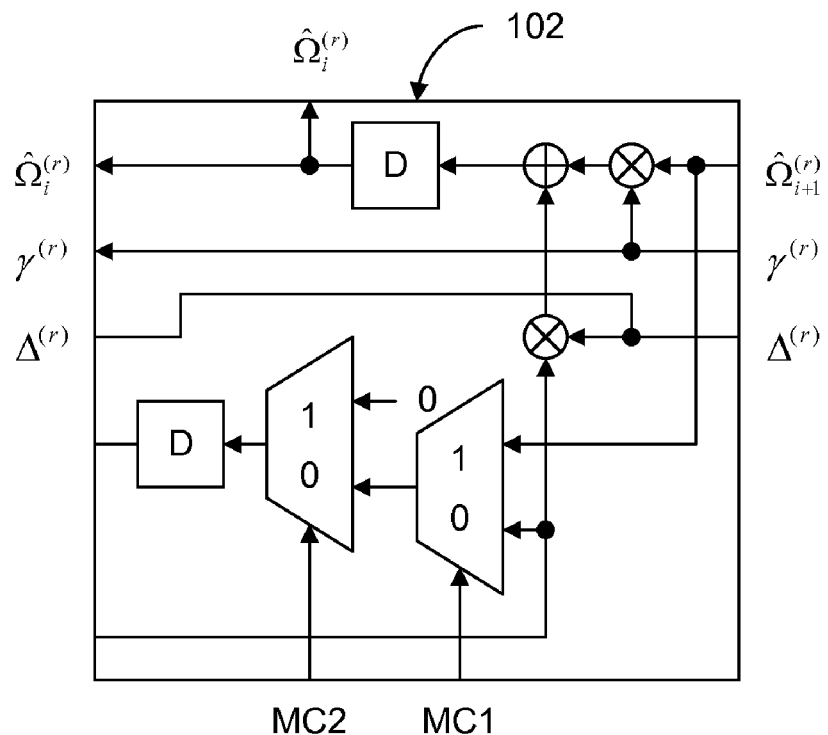
FIG. 1B shows one embodiment of processor element 102 used in system 100 of FIG. 1A.

FIG. 1A is a block diagram illustrating an embodiment of a system that does not load syndromes into an odd-term array. In the example shown, system 100 is composed of 2t+1 systolic units. In this example, the systolic (i.e., regular or repeated) units are referred to as processor elements (102). FIG. 1B shows one embodiment of processor element 102 used in system 100 of FIG. 1A. The critical path of system 100 is composed of one multiplication and one addition, i.e., $$T_{crit} = T_{mult} + T_{add} \quad (7)$$

which is at least twice as fast as the conventional serial implementation, whose critical path is $$2T_{mult} + (1 + \lceil \log_2 t \rceil)T_{add}$$

Upper array 104 computes the even terms of the error locator polynomial while lower array 106 computes the odd terms of the error locator polynomial. System 100 avoids loading odd terms of $\hat{\Omega}^{(0)}(x)$ and $\hat{\Theta}^{(-1)}(x)$. Note, for example, that lower array 106 has constants loaded (e.g., zeros) whereas upper layer 104 has syndromes loaded. Consequently, on average more than half of the units in lower array 106 are idle and system 200 consumes at least 25% less power than some other techniques.

Lemma 2: (i) If modify the initialization $\Lambda^{(0)}(x) = 0$ in the Berlekamp process, then the resulting error locator polynomial is the polynomial composed of the odd terms of the original error locator polynomial. (ii) If modify the initialization $B^{(-1)}(x) = 0$ in the Berlekamp process, then the resulting error locator polynomial is the polynomial composed of the even terms of the original error locator polynomial.

Proof: It is straightforward to show that the original error locator polynomial is the sum of the error locator polynomials obtained from (i) and (ii), respectively. Furthermore, it can be easily shown by induction that at each iteration the error locator polynomial is composed of odd terms in (i) while is composed of even terms in (ii).

Next a second embodiment is presented which replaces lower array 106 of FIG. 1A with a regular (i.e., systolic) error locator update circuit which is not left-shifted and thus reduces the number of units to $$\left\lfloor \frac{3t+3}{2} \right\rfloor.$$

Figure 2A:
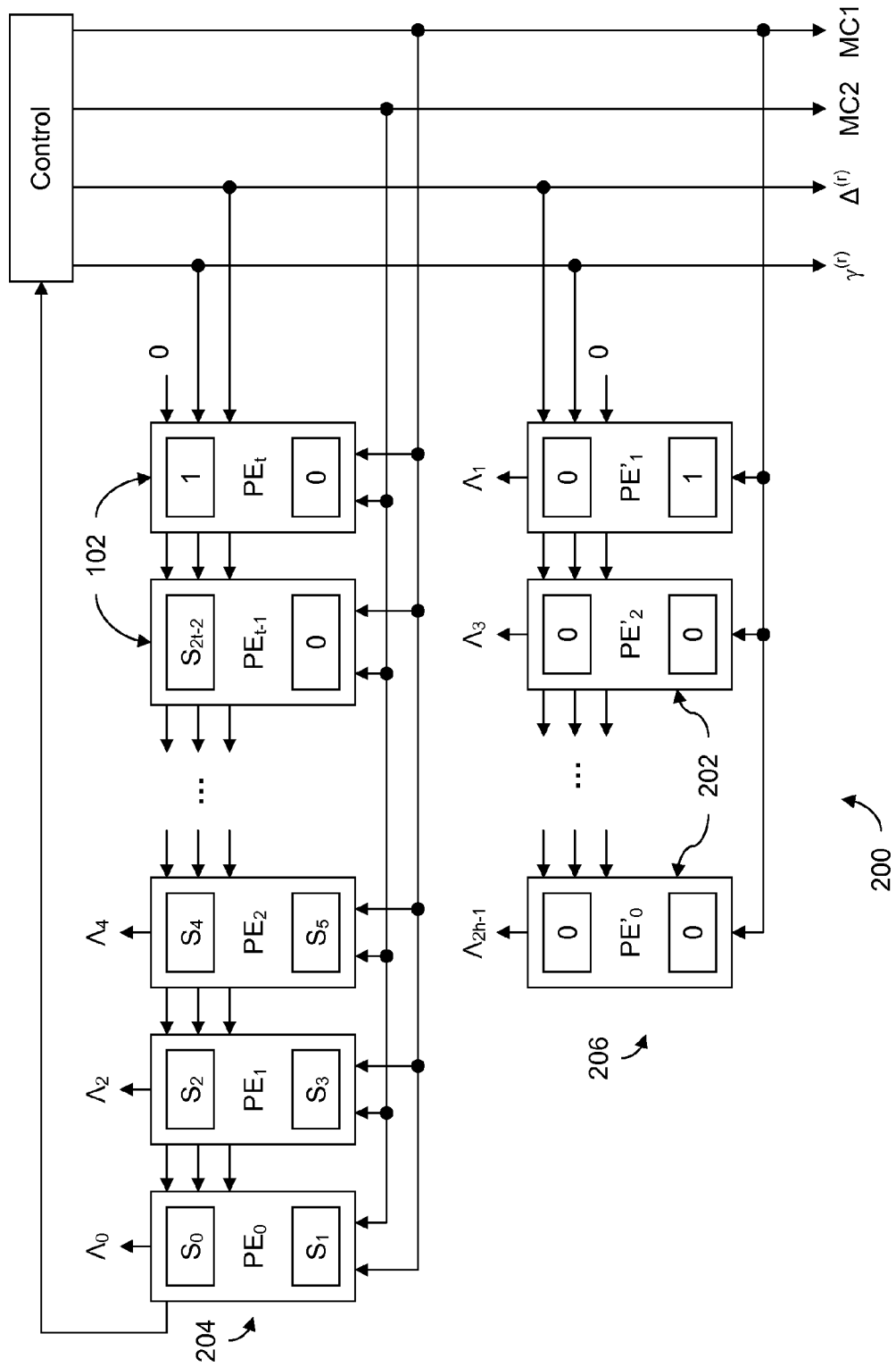
FIG. 2A is block diagram showing an embodiment of a system with even-term and odd-term PEs in which syndromes are not loaded into the odd term array.
Figure 2B:
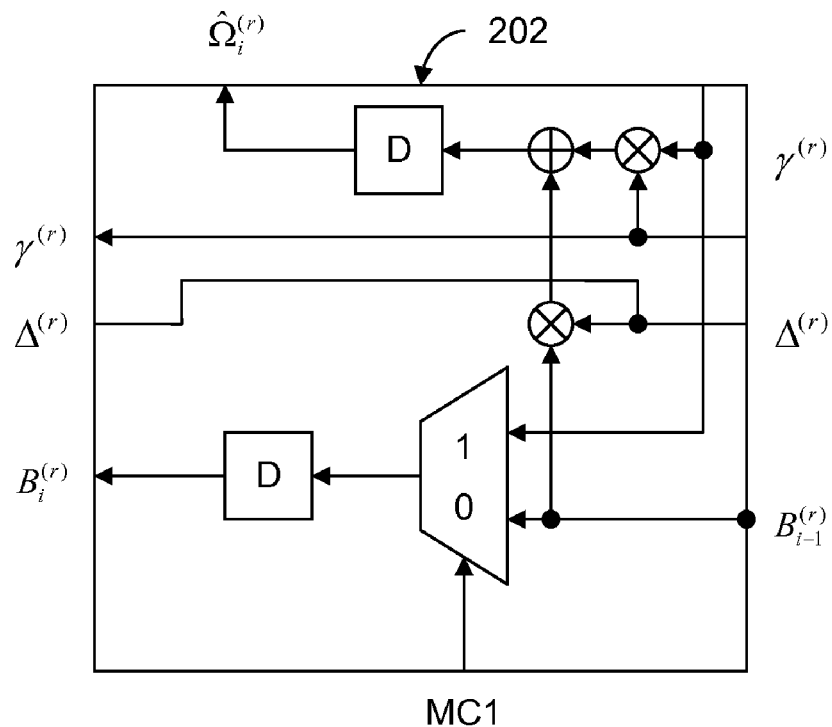
FIG. 2B shows one embodiment of processor element (PE') 202.

The detailed process is described below and the corresponding system is shown in FIGS. 2A and 2B (where $$h \triangleq \left\lfloor \frac{t+1}{2} \right\rfloor$$

).

---

Revised Parallel Inversionless Berlekamp Process (rPIB)

Input: $S = [S_0, S_1, S_2, ..., S_{2t-2}]$
Initialization: $\hat{\Omega}^{(0)}(x) = S_0 + S_2x^2 + S_4x^4 + ... + S_{2t-2}x^{2t-2} + x^{2t}$
$\hat{\Theta}^{(-1)}(x) = S_1 + S_3x^2 + S_5x^4 + ... + S_{2t-3}x^{2t-4} + x^{2t-1}, \Lambda_{odd}^{(0)}(x) = 0,$
$B_{odd}^{(-1)}(x) = 1$
$\gamma^{(0)} = 1, L_\Lambda^{(0)} = 0, L_B^{(-1)} = -1$
• For $r = 0, 2, 4, ..., 2(t-1)$, do:
- $\hat{\Omega}^{(r+2)}(x) = \gamma^{(r)} \cdot [\mathscr{L}_2\hat{\Omega}^{(r)}](x) - \hat{\Omega}_0^{(r)} \cdot \hat{\Theta}^{(r-1)}(x)$
- $\Lambda_{odd}^{(r+2)}(x) = \gamma^{(r)} \cdot \Lambda_{odd}^{(r)}(x) - \hat{\Omega}_0^{(r)} \cdot x^2 B_{odd}^{(r-1)}(x)$
- If $\hat{\Omega}_0^{(r)} \neq 0$ and $2L_\Lambda^{(r)} \leq r$, then
  * Set $\hat{\Theta}^{(r+1)}(x) \leftarrow [\mathscr{L}_2\hat{\Omega}^{(r)}](x), B_{odd}^{(r+1)}(x) \leftarrow \Lambda_{odd}^{(r)}(x)$
  * Set $\gamma^{(r+2)} \leftarrow \hat{\Omega}_0^{(r)}$
  * Set $L_\Lambda^{(r+2)} \leftarrow L_B^{(r-1)} + 2, L_B^{(r+1)} \leftarrow L_\Lambda^{(r)}$
- Else
  * Set $\hat{\Theta}^{(r+1)}(x) \leftarrow \hat{\Theta}^{(r-1)}(x), B_{odd}^{(r+1)}(x) \leftarrow x^2 B_{odd}^{(r-1)}(x)$ -continued Revised Parallel Inversionless Berlekamp Process (rPIB)

```
       * Set γ^(r+2) ← γ^(r)
       * Set L_B^(r+1) ← L_B^(r-1) + 2, L_Λ^(r+2) ← L_Λ^(r)
       endif
     - Set Θ̂_{2t-r-4}^(r+1) = 0
     endfor
     Output: Λ = [Ω̂_0^(2t), Λ_0^(2t), Ω̂_1^(2t), Λ_1^(2t), ..., Ω̂_h^(2t), Λ_h^(2t)]
```

The following figure shows a block diagram of the above rPIB process.

FIG. 2A is block diagram showing an embodiment of a system with even-term and odd-term PEs in which syndromes are not loaded into the odd term array. In the example shown, system 200 includes even-term array 204 and odd-term array 206. Even-term array 204 includes processor elements 102, an embodiment of which is shown in FIG. 1B. Odd-term array 206 includes processor elements 202. FIG. 2B shows one embodiment of processor element (PE') 202.

The third embodiment has a non-zero probability of computing an improper result but is much more efficient (e.g., even smaller) than the first and second embodiments. The Improved Iterative Discrepancy Computation is modified such that $x^{2i}$ is replaced with $x^i$ and $\mathscr{L}_2$ is replaced with $\mathscr{L}_r$.

Improved Iterative Discrepancy Computation Process (Revised)

```
     Input: S = [S_0, S_1, S_2, ..., S_{2t-2}]
     Initialization: Ω̂^(0)(x) = S_0 + S_2 x + S_4 x^2 + ... + S_{2t-2} x^{t-1}
     Θ̂^(-1)(x) = S_1 + S_3 x + S_5 x^2 + ... + S_{2t-3} x^{t-2}
     γ^(0) = 1, L_Λ^(0) = 0, L_B^(-1) = -1
     • For r = 0, 2, 4, ..., 2(t - 1), do:
       - Ω̂^(r+2)(x) = γ^(r) · [𝓛_1 Ω̂^(r)](x) − Ω̂_0^(r) · Θ̂^(r-1)(x)
       - If Ω̂_0^(r) ≠ 0 and 2L_Λ^(r) ≤ r, then
         * Set Θ̂^(r+1)(x) ← [𝓛_1 Ω̂^(r)](x),
         * Set γ^(r+2) ← Ω̂_0^(r)
         * Set L_Λ^(r+2) ← L_B^(r-1) + 2, L_B^(r+1) ← L_Λ^(r)
       - Else
         * Set Θ̂^(r+1)(x) ← Θ̂^(r-1)(x),
         * Set γ^(r+2) ← γ^(r)
         * Set L_B^(r+1) ← L_B^(r-1) + 2, L_Λ^(r+2) ← L_Λ^(r)
       endif
     endfor
     Output: Δ = [Ω̂_0^(0), Ω̂_0^(2), Ω̂_0^(4), ..., Ω̂_0^(2t-2)]
```

Next, a new process is presented and characterized.

Variant Parallel Inversionless Berlekamp Process (vPIB)

```
     Input: S = [S_0, S_1, S_2, ..., S_{2t-2}]
     Initialization: Ω̂^(0)(x) = S_0 + S_2 x + S_4 x^2 + ... + S_{2t-2} x^{t-1}, Λ^(0)(x) = x^t
     Θ̂^(-1)(x) = S_1 + S_3 x + S_5 x^2 + ... + S_{2t-3} x^{t-2}, xB^(-1)(x) = x^t
     γ^(0) = 1, L_Λ^(0) = 0, L_B^(-1) = -1
     • For r = 0, 2, 4, ..., 2(t - 1), do:
       - Ω̂^(r+2)(x) = γ^(r) · [𝓛_1 Ω̂^(r)](x) − Ω̂_0^(r) · Θ̂^(r-1)(x),
       - Λ^(r+2)(x) = γ^(r) · [𝓛_1 Λ^(r)](x) − Ω̂_0^(r) · xB^(r-1)(x)
       - If Ω̂_0^(r) ≠ 0 and 2L_Λ^(r) ≤ r, then
         * Set Θ̂^(r+1)(x) ← [𝓛_1 Ω̂^(r)](x), xB^(r+1)(x) ← Λ^(r)(x)
         * Set γ^(r+2) ← Ω̂_0^(r)
         * Set L_Λ^(r+2) ← L_B^(r-1) + 2, L_B^(r+1) ← L_Λ^(r)
       - Else
         * Set Θ̂^(r+1)(x) ← Θ̂^(r-1)(x), xB^(r+1)(x) ← x · xB^(r-1)(x)
         * Set γ^(r+2) ← γ^(r)
         * Set L_B^(r+1) ← L_B^(r-1) + 2, L_Λ^(r+2) ← L_Λ^(r)
       endif
     - Set Θ̂_{t-(r/2)-2}^(r+1) = 0
     endfor
     Output: Λ = [Λ_0^(2t), Λ_1^(2t), Λ_2^(2t), ..., Λ_t^(2t)]
```

Note that in vPIB, xB(x), instead of B(x), is traced, so that the error-locator update $$\hat{\Lambda}^{(r+2)}(x) = \gamma^{(r)} \cdot [\mathscr{L}_r \hat{\Lambda}^{(r)}](x) - \hat{\Omega}_0^{(r)} \cdot \hat{x}\hat{B}^{(r-1)}(x)$$

is retained to be consistent with the discrepancy computation, $$\hat{\Omega}^{(r+2)}(x) = \gamma^{(r)} \cdot [\mathscr{L}_r \hat{\Omega}^{(r)}](x) - \hat{\Omega}_0^{(r)} \cdot \hat{\Theta}^{(r-1)}(x).$$

Figure 3A:
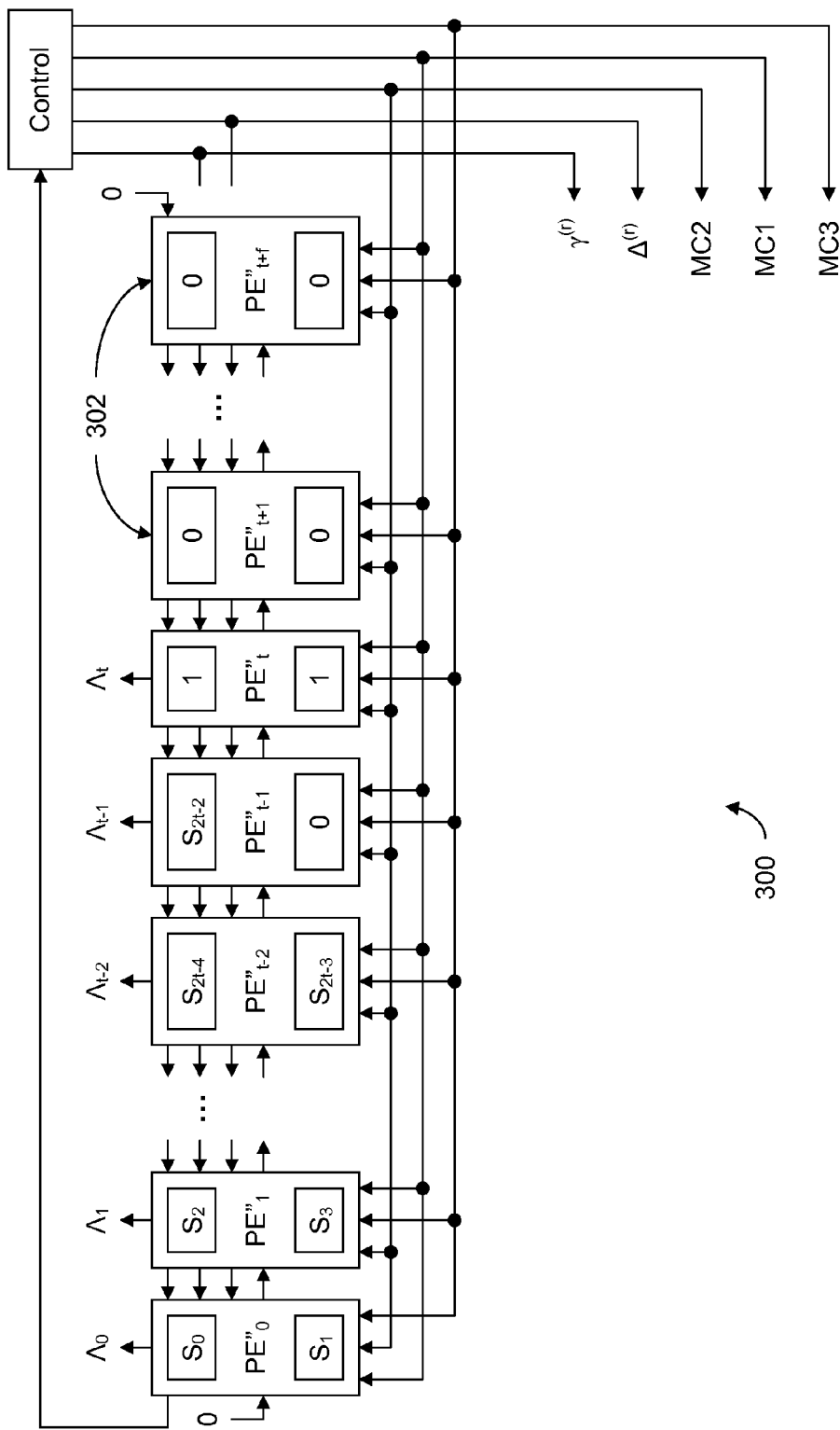
FIG. 3A is a block diagram showing an embodiment of a system with a non-zero probability of computing an improper result.
Figure 3B:
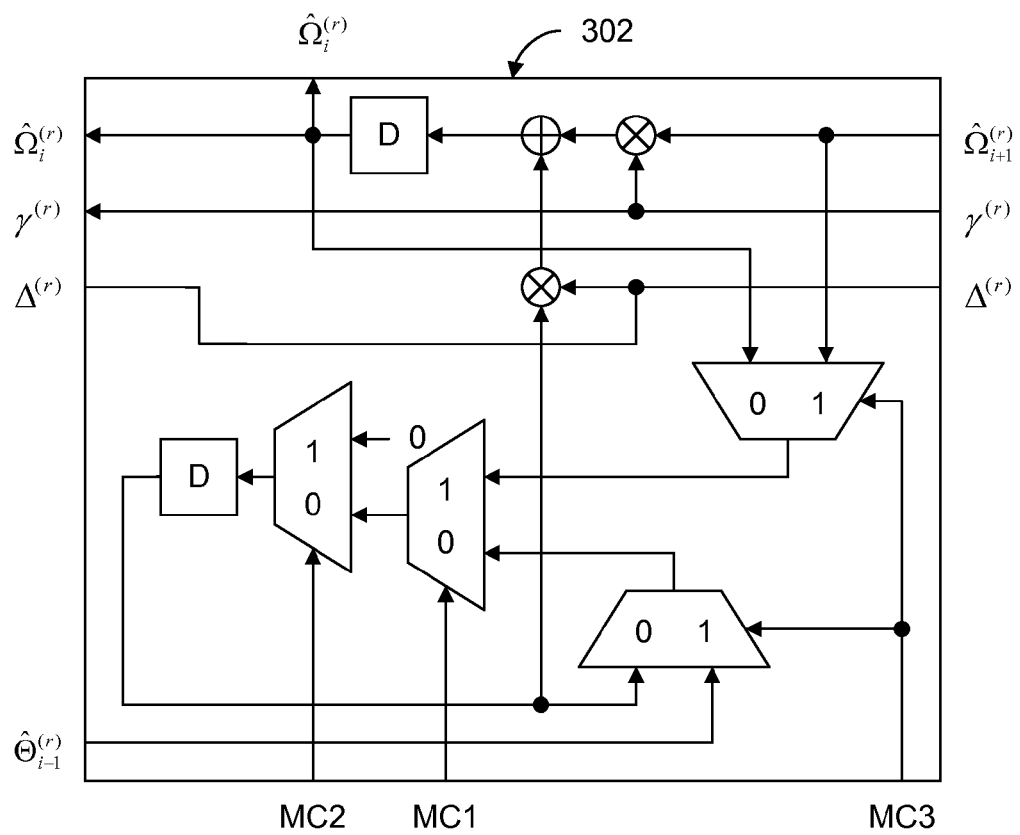
FIG. 3B shows one embodiment of processor element (PE'') 302.

FIG. 3A is a block diagram showing an embodiment of a system with a non-zero probability of computing an improper result. FIG. 3B shows one embodiment of processor element (PE") 302. In the example shown, control signal MC3 in system 300 denotes a (t+f)-dimension binary vector v whose each bit controls a multiplexer. f is a small constant independent of t, a parameter to be discussed shortly. v is initialized to $$v^{(0)} = [0, 0, \ldots, 0_{t-1}, 1_t, \ldots, 1].$$

At each iteration r=2i, the rightmost zero is flipped, such that $$v^{(r)} = [0, 0, \ldots, 0_{t-i-1}, 1_{t-i}, \ldots, 1]$$

Next the defect probability of the proposed decoding process is considered. Note that the architecture overflows whenever the degree of $x\hat{B}^{(r-1)}(x)$ is greater than $$\frac{r}{2} + f,$$

which is caused by the right-shift operations, $\hat{x}\hat{B}^{(r+1)}(x) \leftarrow x \cdot \hat{x}\hat{B}^{(r-1)}(x)$. A defect occurs if xB(x) overflows and is later used to update Λ(x). Equivalently, a defect occurs if the length of $$xB^{(r-1)}(x) \text{ is } \frac{r}{2} + f + 1$$

and the number of errors is greater than r/2+f. Lemma 1 indicates that $$L_\Lambda^{(r)} + L_{xB}^{(r-1)} = r$$

which immediately yields $$L_\Lambda^{(r)} = \frac{r}{2} - f - 1.$$

It indicates that f+1 consecutive zero discrepancies occur at the iterations r−2(f−1), r−2(f−2), ..., r. When the number of errors is greater than $$\frac{r}{2} + f,$$

it is reasonable to assume each discrepancy, $\Delta^{(r-2(f-1))}$, $\Delta^{(r-2(f-2))}$, ..., $\Delta^{(r)}$, is randomly chosen within $GF(2^m)$ and thus the probability of being zero is $2^{-m}$. Subsequently, the probability of occurring f+1 consecutive zero discrepancies, $\Delta^{(i)} = 0$, i=r−2(f−1), r−2(f−2), ..., r, is $2^{-(f+1)m}$. Therefore, the decoder defect probability is upper bounded by $2^{-(f+1)m}$. The above discussion is summarized into the following lemma.

Lemma 3: When t+f units are used in the proposed vPIB architecture, the resulting defect probability is upper bounded by $2^{-(f+1)m}$, where m denotes the finite field dimension.

Figure 4:
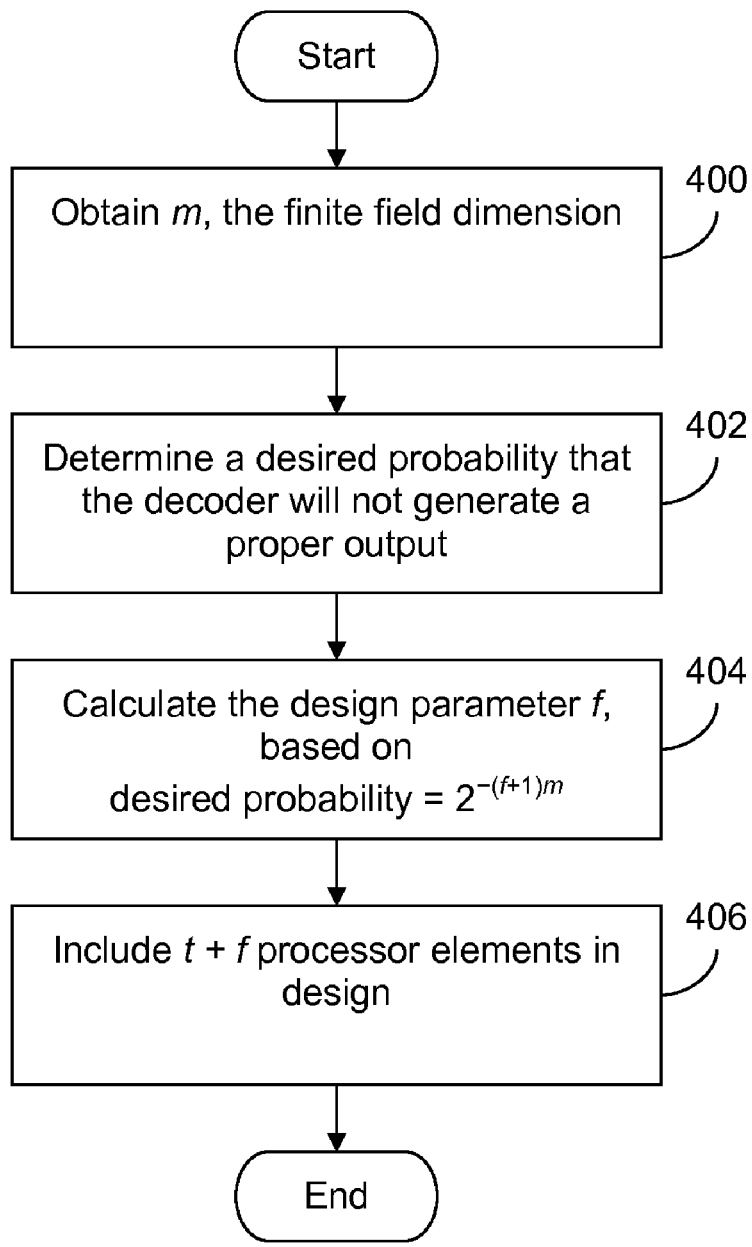
FIG. 4 is a flowchart illustrating an embodiment of a process for calculating a design parameter f in order for a system to achieve a desired probability.

FIG. 4 is a flowchart illustrating an embodiment of a process for calculating a design parameter f in order for a system to achieve a desired probability. For example, a system similar to that shown in FIG. 3B is being designed or otherwise configured. At 400, m, the finite field dimension, is obtained. At 402, a desired probability that the decoder will not generate a proper output is determined. In some embodiments, a desired probability is required to be or is rounded to the nearest power of two (i.e., $2^i$, where i is a positive integer). In various embodiments, the desired probability depends on a variety of factors, such as an expected error rate, an expected signal to noise ratio, acceptable system tolerance, etc. At 404, the design parameter f is calculated based on: desired probability=$2^{-(f+1)m}$. At 406, t+f processor elements are included in the design. One example of a processor element that may be used is shown in FIG. 3B.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for processing binary Bose-Chaudhuri-Hocquenghem (BCH) encoded data, comprising:
   obtaining a subset of even-term syndromes associated with the binary BCH encoded data, wherein a subset of odd-term syndromes is associated with the subset of even-term syndromes;
   during initialization of a variant error-locator polynomial, $\hat{\Omega}(x)$, using a processor to load the subset of even-term syndromes into the variant error-locator polynomial at a $0^{th}$ iteration of a decoding process, $\hat{\Omega}^{(0)}(x)$, wherein an error locator polynomial at an $r^{th}$ iteration of the decoding process, $\Lambda^{(r)}(x)$, a syndrome polynomial, $S(x)$, an error evaluator polynomial at the $r^{th}$ iteration of the decoding process, $\Omega^{(r)}(x)$, and the variant error-locator polynomial at the $r^{th}$ iteration of the decoding process, $\hat{\Omega}^{(r)}(x)$, have the following relationship: $\Lambda^{(r)}(x)S(x)=\Omega^{(r)}(x) +x^r\hat{\Omega}^{(r)}(x)$; and
   excluding the subset of odd-term syndromes from the initialization of the variant error-locator polynomial at the $0^{th}$ iteration of the decoding process, $\hat{\Omega}^{(0)}(x)$.

2. The method of claim 1, wherein loading further comprises using zero values in place of the subset of odd-term syndromes.

3. The method of claim 1, wherein the process is performed during an iterative discrepancy calculation which outputs discrepancy values, $\Delta$.

4. The method of claim 1, wherein the process is performed during a parallel inversionless Berlekamp process which outputs an error locator polynomial, $\Lambda$.

5. The method of claim 1 further comprising using an odd-term error-locator update module which is not left shifted.

6. A system for processing binary Bose-Chaudhuri-Hocquenghem (BCH) encoded data, comprising:
   an interface configured to obtain a subset of even-term syndromes associated with the binary BCH encoded data, wherein a subset of odd-term syndromes is associated with the subset of even-term syndromes; and
   an initialization module configured to:
      during initialization of a variant error-locator polynomial, $\hat{\Omega}(x)$, to load the subset of even-term syndromes into the variant error-locator polynomial at a $0^{th}$ iteration of a decoding process, $\hat{\Omega}^{(0)}(x)$, wherein an error locator polynomial at an $r^{th}$ iteration of the decoding process, $\Lambda^{(r)}(x)$, a syndrome polynomial, $S(x)$, an error evaluator polynomial at the $r^{th}$ iteration of the decoding process, $\Omega^{(r)}(x)$, and the variant error-locator polynomial at the $r^{th}$ iteration of the decoding process, $\hat{\Omega}^{(r)}(x)$, have the following relationship: $\Lambda^{(r)}(x)S(x)=\Omega^{(r)}(x) +x^r\hat{\Omega}^{(r)}(x)$; and
   exclude the subset of odd-term syndromes from the initialization of the variant error-locator polynomial at the $0^{th}$ iteration of the decoding process, $\hat{\Omega}^{(0)}(x)$.

7. The system of claim 6, wherein the initialization module is further configured to use zero values in place of the subset of odd-term syndromes.

8. The system of claim 6, wherein the system is included in an iterative discrepancy calculation system which outputs discrepancy values, $\Delta$.

9. The system of claim 6, wherein the system is included in a parallel inversionless Berlekamp system which outputs an error locator polynomial, $\Lambda$.

10. The system of claim 6, wherein the system includes at least 2t +1 systolic units, where t is an error correction capability.

11. The system of claim 6 further comprising an odd-term error-locator update module which is not left shifted.

12. A computer program product for processing binary Bose-Chaudhuri-Hocquenghem (BCH) encoded data, the computer program product being embodied in a non-transitory computer readable medium and comprising computer instructions for:
   obtaining a subset of even-term syndromes associated with the binary BCH encoded data, wherein a subset of odd-term syndromes is associated with the subset of even-term syndromes;
   during initialization of a variant error-locator polynomial, $\hat{\Omega}(x)$, loading the subset of even-term syndromes into the variant error-locator polynomial at a $0^{th}$ iteration of a decoding process, $\hat{\Omega}^{(0)}(x)$, wherein an error locator polynomial at an $r^{th}$ iteration of the decoding process, $\Lambda^{(r)}(x)$, a syndrome polynomial, $S(x)$, an error evaluator polynomial at the $r^{th}$ iteration of the decoding process, $\Omega^{(r)}(x)$, and the variant error-locator polynomial at the $r^{th}$ iteration of the decoding process, $\hat{\Omega}^{(r)}(x)$, have the following relationship: $\Lambda^{(r)}(x)S(x) =\Omega^{(r)}(x) +x^r\hat{\Omega}^{(r)}(x)$; and
   excluding the subset of odd-term syndromes from the initialization of the variant error-locator polynomial at the $0^{th}$ iteration of the decoding process, $\hat{\Omega}^{(0)}(x)$.

13. The computer program product of claim 12, wherein the computer instructions for loading further include computer instructions for using zero values in place of the subset of odd-term syndromes.

14. The computer program product of claim 12, wherein the computer instructions are performed during an iterative discrepancy calculation which outputs discrepancy values, $\Delta$.

15. The computer program product of claim 12, wherein the computer instructions are performed during a parallel inversionless Berlekamp process which outputs an error locator polynomial, $\Lambda$.

16. The computer program product of claim 12 further comprising computer instructions for using an odd-term error-locator update module which is not left shifted.

* * * * *